(12) United States Patent
Tseng et al.

(10) Patent No.: US 9,350,136 B2
(45) Date of Patent: May 24, 2016

(54) PROGRAMMABLE LASER DEVICE AND METHOD FOR CONTROLLING THE SAME

(75) Inventors: Jie-Ting Tseng, Tainan (TW); Sung-Ho Liu, Kaohsiung (TW); Min-Kai Lee, Tainan County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1524 days.

(21) Appl. No.: 12/120,618

(22) Filed: May 14, 2008

(65) Prior Publication Data
US 2009/0135863 A1 May 28, 2009

(30) Foreign Application Priority Data

Nov. 28, 2007 (TW) .............................. 96145078 A

(51) Int. Cl.
*H01S 3/10* (2006.01)
*H01S 3/11* (2006.01)
*H01S 5/062* (2006.01)

(52) U.S. Cl.
CPC ... *H01S 3/10* (2013.01); *H01S 3/11* (2013.01); *H01S 5/06216* (2013.01); *H01S 5/06233* (2013.01)

(58) Field of Classification Search
CPC ..... H01S 3/10; H01S 3/1305; H01S 5/06216; H01S 5/06233; H01S 3/11
USPC ................................................ 372/25, 30–33
See application file for complete search history.

(56) References Cited

U.S. PATENT DOCUMENTS

2006/0067706 A1* 3/2006 Watabe .......................... 398/182
2006/0098216 A1* 5/2006 Sugimoto ...................... 358/1.5

FOREIGN PATENT DOCUMENTS

| CN | 1340721 | 3/2002 |
| JP | 345517 | 11/1998 |
| JP | 2001353585 | 12/2001 |
| JP | 2002361448 | 12/2002 |

(Continued)

*Primary Examiner* — Joshua King
(74) *Attorney, Agent, or Firm* — WPAT, PC; Justin King; Jonathan Chiang

(57) ABSTRACT

A programmable laser trigger device and the method for controlling the same are disclosed. The programmable laser trigger device comprises: an external signal module and a command executing module. The external signal module is capable of interfacing the inputs and outputs of waveform command and signals. The command executing module further comprises: a waveform command memory, for storing the waveform command; a waveform command decoder; a waveform generator; and a buffer memory, acting as a waveform trigger parameter buffer between the waveform command decoder and the waveform generator; wherein the waveform command decoder accesses the waveform command stored in the memory for pre-decoding an executing code while generating a sequence of waveform trigger parameters to be stored in the buffer memory, which provides the waveform generator with the sequence of waveform trigger parameters to be transformed into a pulse-width modulation (PWM) pulse train. With the aforesaid device and method, not only unequal pulse outputs can be generated with good flexibility for matching the needs of various manufacturing processes, but also through the instructions to an external feedback signal from the waveform command, the laser pulses outputted therefrom can be modulated in real time in response to the external feedback signal.

21 Claims, 4 Drawing Sheets

(56) References Cited

FOREIGN PATENT DOCUMENTS

| TW | 332351 | 5/1998 |
| TW | 345517 | 11/1998 |
| TW | 419409 | 1/2001 |

\* cited by examiner

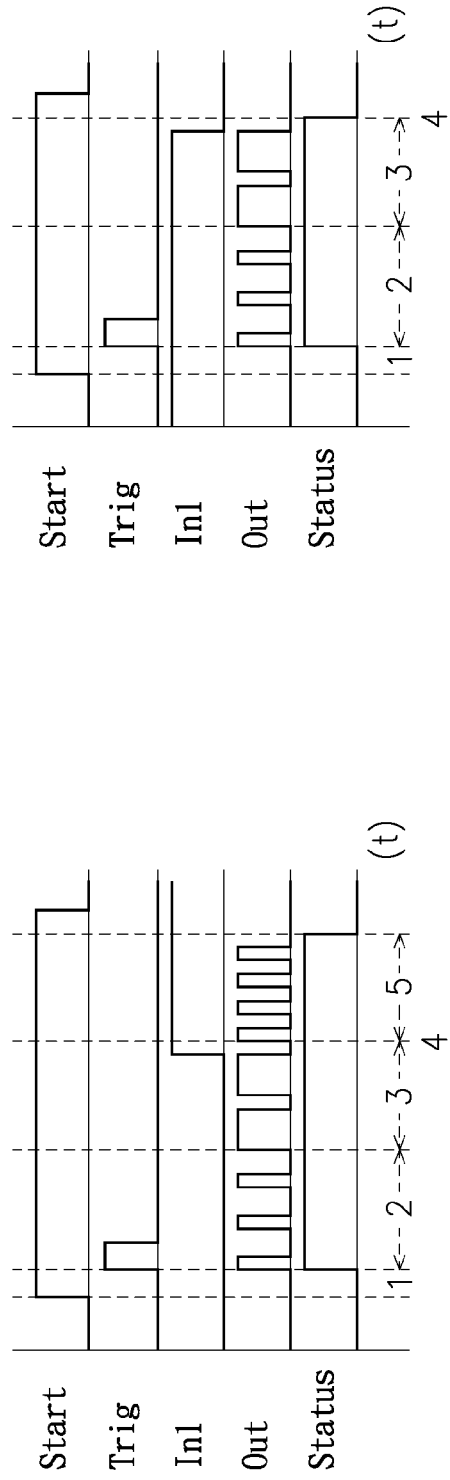
FIG. 5
| No. | Command | OP1 | OP2 | OP3 | Note |
|---|---|---|---|---|---|
| 1 | WAIT | Trig | | | Waiting for Trig |
| 2 | PWM | 750 | 33 | 3 | Executing PWM |
| 3 | PWM | 1000 | 75 | 2 | |
| 4 | BTEST | In1 | 0 | 1 | Testing Ext. IO Signal |
| 5 | PWM | 500 | 50 | 4 | |
| 6 | JMP | 1 | | | GoTo |
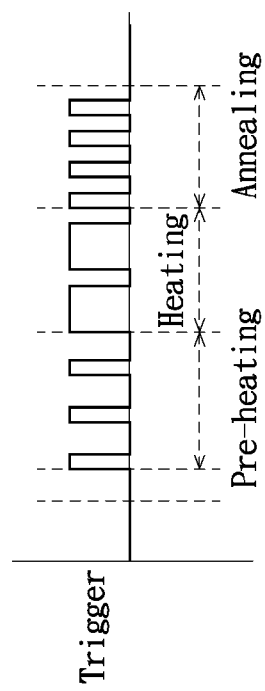
FIG. 4
FIG. 6
FIG. 7

PROGRAMMABLE LASER DEVICE AND METHOD FOR CONTROLLING THE SAME

BACKGROUND OF THE INVENTION

1. Field of the Invention

The present invention generally relates to a programmable laser trigger device and method for controlling the same and, more particularly, to a programmable laser trigger device and method for controlling the programmable laser trigger device, capable of generating unequal pulse outputs with good flexibility to meet the requirements of various manufacturing processes and modulating the output laser pulses in real time in response to an external feedback signal.

2. Description of the Prior Art

The conventional laser is triggered with equal distances or equal time intervals. To meet the requirements for new processes, the machining shapes are diverse. Therefore, the laser control method and apparatus with fixed parameters are out of date. For the formation of a V-groove on a large-area laser light-guide plate using laser cutting, the formed V-groove is not smooth since the output laser energy is fixed and the speed of the operation plate is variable. For laser pre-heat machining, for example in glass cutting or metal welding, low energy and high energy are alternately output during laser machining to improve the machining quality.

In Taiwan Patent No. 85110718 "Laser Machining Device and Laser Device", the laser is driven by a fixed-frequency and fixed-pulse-width signal to oscillate within a certain cycle and the output laser power is determined by the pulse width. Therefore, this patent is problematic in low precision and poor flexibility in laser machining without real-time laser power modulation and compensation.

Accordingly, the conventional laser controller only provides a monotonous pulse signal for simple laser machining. It is a key topic in providing a variety of laser trigger waveforms (for laser power control) capable of being controlled according to the environments.

SUMMARY OF THE INVENTION

It is an object of the present invention to provide a programmable laser trigger device and method for controlling the programmable laser trigger device, capable of generating unequal pulse outputs with good flexibility to meet the requirements of various manufacturing processes and modulating the output laser pulses in real time in response to an external feedback signal.

In order to achieve the foregoing or other objects, the present invention provides a programmable laser trigger device and the method for controlling. The programmable laser trigger device comprises: an external signal module and a command executing module. The external signal module is capable of interfacing the inputs and outputs of waveform command and signals. The command executing module further comprises: a waveform command memory, for storing the waveform command; a waveform command decoder; a waveform generator; and a buffer memory, acting as a waveform trigger parameter buffer between the waveform command decoder and the waveform generator; wherein the waveform command decoder accesses the waveform command stored in the memory for pre-decoding an executing code while generating a sequence of waveform trigger parameters to be stored in the buffer memory, which provides the waveform generator with the sequence of waveform trigger parameters to be transformed into a pulse-width modulation (PWM) pulse train.

BRIEF DESCRIPTION OF THE DRAWINGS

The objects, spirits and advantages of the embodiment of the present invention will be readily understood by the accompanying drawings and detailed descriptions, wherein:

FIG. 4 shows a user-programmed pulse waveform;

FIG. 5 is a table of commands programmed according to the waveform in FIG. 4;

FIG. 6 shows a laser trigger signal programmed according to the commands in FIG. 5; and FIG. 7 shows an output pulse based on external feedback signals.

DETAILED DESCRIPTION OF THE PREFERRED EMBODIMENT

The present invention can be exemplified by but not limited to the embodiments as described hereinafter.

Figure 1:
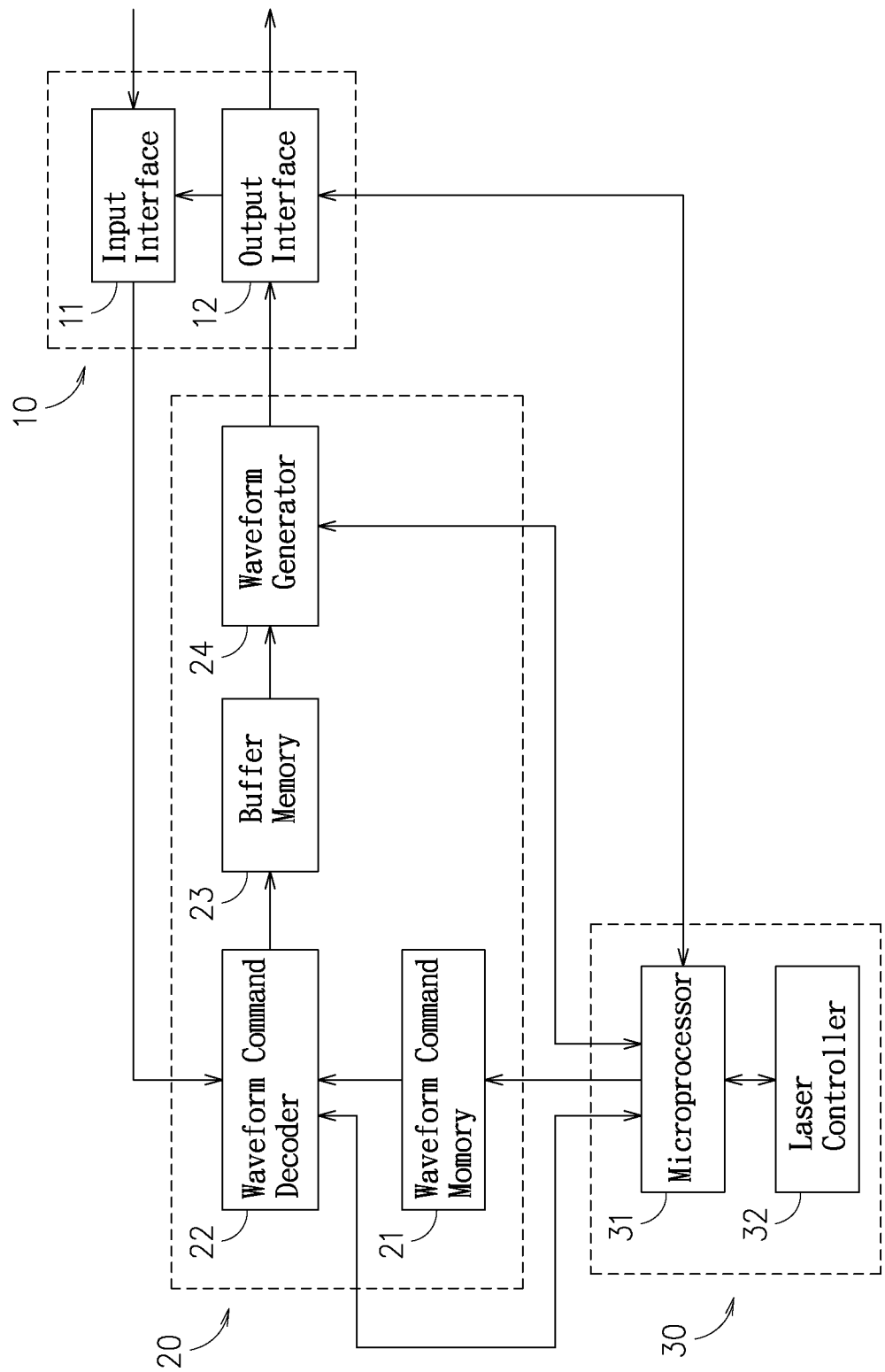
FIG. 1 is a schematic diagram of a programmable laser trigger device according to the present invention.

Please refer to FIG. 1, which is a schematic diagram of a programmable laser trigger device according to the present invention. The programmable laser trigger device comprises an external signal module 10, a command executing module 20 and a management module 30.

It is noted that the waveforms hereinafter are referred to as pulse-width modulation (PWM) waveforms. The external signal module 10 is capable of interfacing the inputs and outputs of waveform command and signals. The external signal module 10 comprises at least an input interface 11 and at least an output interface 12. The input interface 11 is capable of decoding external signals from a digital signal input, a decoder, and a digital-analog converter and providing the command decoder with the signal states. The output interface 12 is capable of outputting the pulse train. Moreover, an output restriction mechanism (not shown) can be disposed at the output interface 12 to determine protection parameters to prevent abnormal output waveforms. Moreover, in the present invention, the external signal module 10 is used with a management module 30, comprising a microprocessor 31 and a laser controller 32. The microprocessor is an interface for accessing the waveform command. The microprocessor 31 uses execution commands to achieve optimal execution efficiency.

The laser controller 32 is capable of controlling and communicating the programmable laser trigger device of the present invention and the user. The laser controller 32 is capable of generating a waveform command and transmitting the waveform command into the command executing module 20 for waveform transform. The laser controller 32 comprises a user interface capable of editing and displaying a programmed waveform. Generally, the user interface comprises at least one of an input device such as a button, a keyboard, a mouse and a display device such as a monitor.

The command executing module 20 further comprises at least a waveform command memory 21, at least a waveform command decoder 22, at least a waveform generator 24 and at least a buffer memory 23. The waveform command memory 21 is capable of storing the waveform command. The waveform command decoder 22 is capable of accessing the waveform command to be decoded and executed. The buffer memory 23, implemented using a first-in-first-out (FIFO) memory or a memory with a buffer, is used as a waveform trigger parameter buffer between the waveform command decoder and the waveform generator 24. The waveform command decoder 24 transforms a sequence of waveform trigger parameters into a pulse-width modulation (PWM) pulse train. It is noted that the waveform command memory 21 and the buffer memory 23 are different in structures and functions. The waveform command memory 21 is a random access memory (RAM), in which the commands are accessed and executed by the waveform command decoder. The buffer memory 23 is a FIFO memory, in which the waveform output from the waveform command decoder is stored. When it comes to functions, the waveform command memory 21 stores waveform description programs having commands such as waveform commands and flow deciding commands, while the buffer memory 23 stores waveform parameters simply for the waveform generator to generate continuous trigger waveforms. Moreover, the purpose of the buffer memory 23 is to enable the waveform generator to output waveforms continuously without being influenced by the waveform command decoder 22. In other words, the waveform command memory 21 and the buffer memory 23 are memories with different structures and functions, which cannot be replaced by a single memory.

Figure 2:
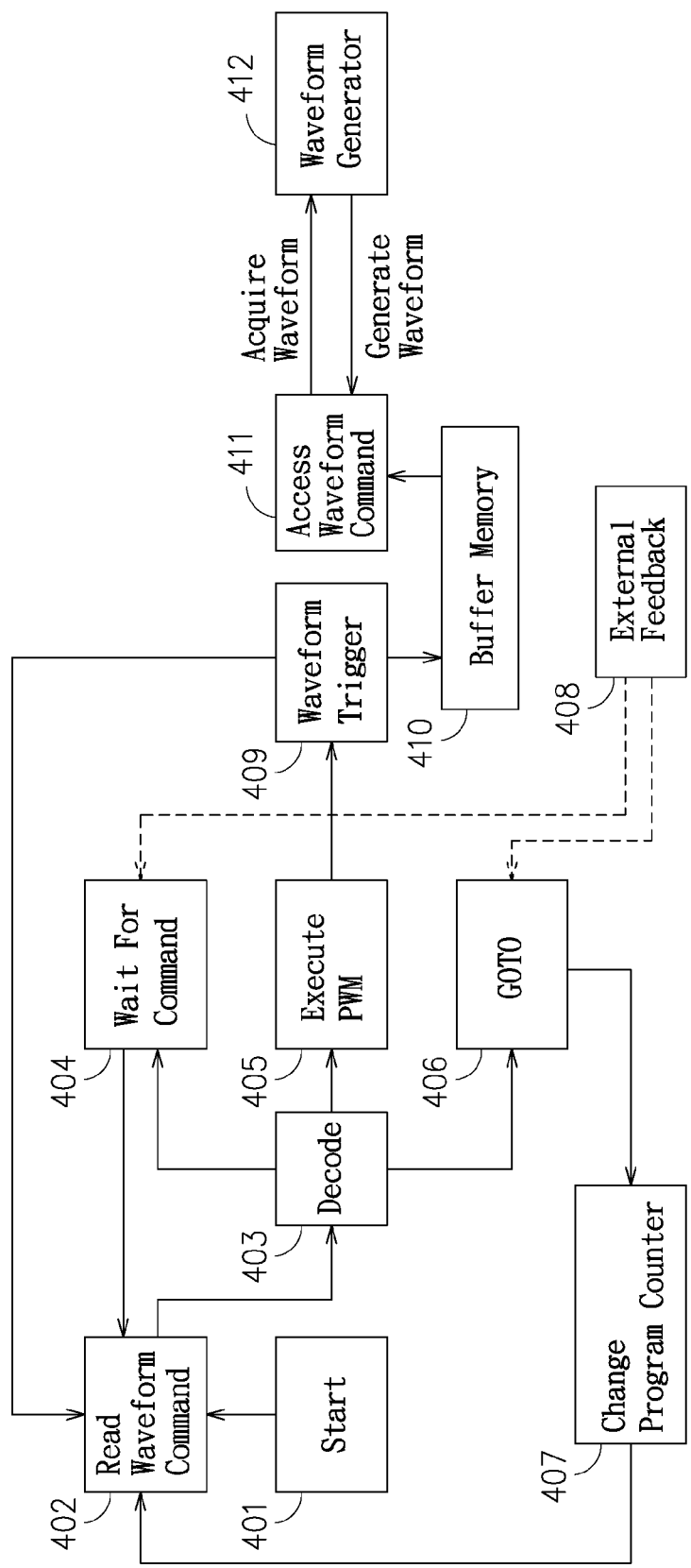
FIG. 2 is a flow-chart for controlling a programmable laser trigger device according to the present invention.

Please refer to FIG. 2 for a flow-chart showing a method for controlling a programmable laser trigger device in FIG. 1 according to the present invention.

In Step 401, the method starts.

In Step 402, a waveform command is accessed. The waveform command decoder 22 in the command executing module 20 in FIG. 1 accesses the waveform command from the waveform command memory 21 according to a program counter (PC) value. The PC value is accumulative after a command is executed so that a next command is to be executed. Therefore, the flow-chart can be controlled using an unconditional or conditional branch command to change the PC value.

In Step 403, the waveform command is decoded. The waveform command decoder 22 decodes the accessed waveform command and interprets the parameters in the waveform command to execute the commands.

In Step 404, a wait command is output from the external signal module 10 to wait for an external feedback signal so that following commands are executed after the external feedback signal is established.

In Step 405, waveform trigger parameters are set by a pulse-width modulation (PWM) command.

In Step 406, a GOTO command is output from the external signal module 10 to comprise an unconditional or conditional branch command such as JMP and BTEST.

In Step 407, the PC value is changed. As described in Step 402, the waveform command decoder 22 accesses the waveform command according to the PC value, which is changed by the branch command. Therefore, when an unconditional or conditional branch command such as JMP and BTEST is received (Step 406), the PC value is changed to control the flow-chart in Step 402.

In Step 408, an external feedback signal comprising signals from a position decoder, a speedometer/accelerometer and a thermometer is transmitted to the wait command and the GOTO command in Step 404 and Step 406.

In Step 409, waveform trigger parameters set in Step 405 are received and registered in the buffer memory.

So far, the waveform command decoder 22 in FIG. 1 has completed the execution of a command. Step 401 to Step 409 are all executed by the waveform command decoder.

In Step 410, a buffer memory, implemented using a FIFO memory, is used as a waveform trigger parameter buffer between the waveform command decoder and the waveform generator to enable the waveform generator to output continuously.

In Step 411, the waveform trigger parameters are acquired from the buffer memory and transmitted to a waveform generator 24.

In Step 412, a sequence of waveform trigger parameters are transformed into a pulse-width modulation (PWM) pulse train by the waveform generator 24. After a waveform is generated, the waveform generator 24 uses a waveform generating signal transmitted to Step 411 to acquire a next waveform command to be generated.

After the foregoing steps are completed, the pulse-width modulation (PWM) pulse train is transmitted to the laser trigger device so as to generate unequal pulse outputs with good flexibility to meet the requirements of various manufacturing processes and modulate the output laser pulses in real time in response to an external feedback signal.

Figure 3:
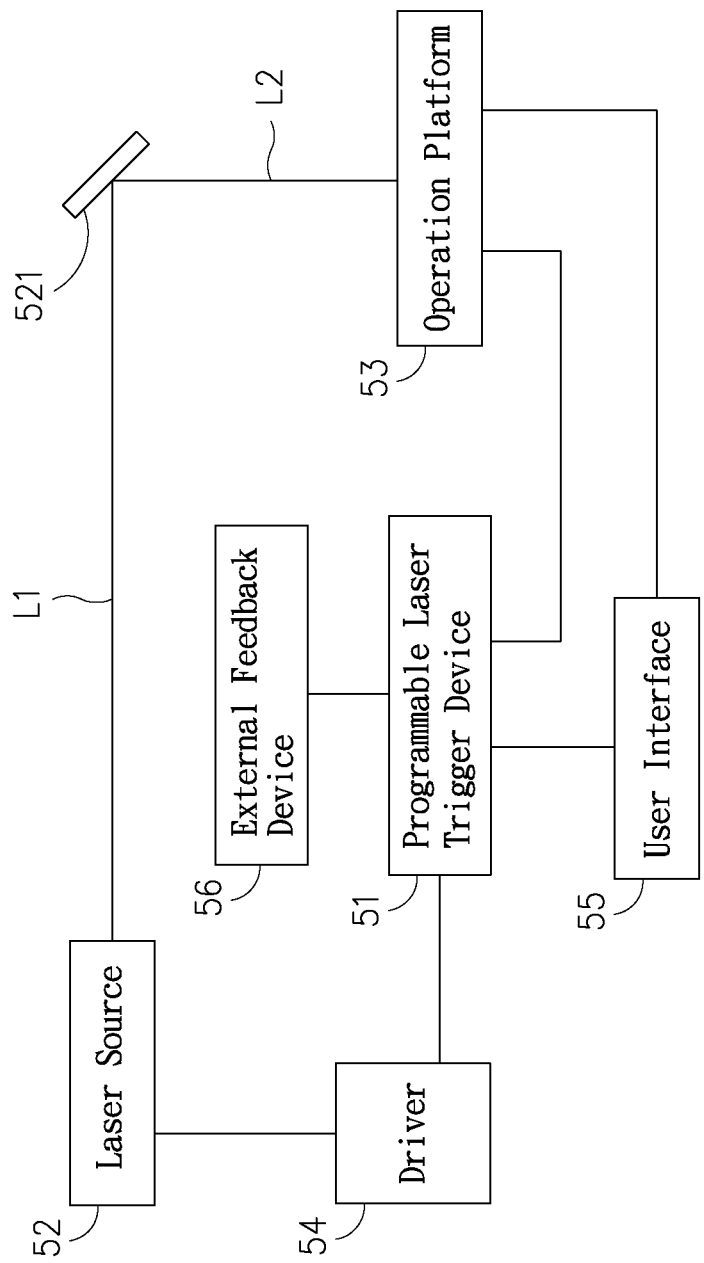
FIG. 3 is a schematic diagram of a laser machining system using a programmable laser trigger device according to the present invention.

Please refer to FIG. 3, which is a schematic diagram of a laser machining system using a programmable laser trigger device according to the present invention. The laser machining system 50 comprises a programmable laser trigger device 51, a laser source 52 and an operation platform 53. The programmable laser trigger device 51 and the laser source 52 are driven by a driver 54. The laser source 52 is capable of generating a laser light L1, which is deviated by a light path system 521 to become a machining laser light L2 for the operation platform 53. A user interface 55 can be used by the user to edit and display a programmed waveform and transmit the programmed waveform to the programmable laser trigger device 51. In other words, by transmitting the waveform command to the programmable laser trigger device 51, the programmable laser trigger device 51 generates a pulse-width modulation (PWM) pulse train (from Step 401 to Step 412) according to the waveform command designated by the user to change the laser power of the machining laser light L2 in real time. Moreover, the programmable laser trigger device 51 is connected to an external feedback device 56, which is a position decoder, speedometer/accelerometer, or a thermometer. An external feedback signal from the external feedback device 56 can be used for to provide external information such as coordinates, speed, acceleration, and temperature.

Please refer to FIG. 4 to FIG. 6, which describe an example of the programming for laser machining according to the present invention. First, a laser trigger waveform is programmed by the user, as shown in FIG. 4, which comprises periods for pre-heating, heating and annealing, each having different waveforms. Then, as shown in FIG. 5, the commands labeled No. 1 to No. 6 are programmed according to the waveform, which are described hereinafter.

No. 1: WAIT Trig. A trigger signal is awaited.
Referring to the flow-chart in FIG. 2, the flow goes from Step 402 for reading the waveform command, to Step 403 for decoding, to Step 404 for waiting for the trigger signal, and to Step 402 after the trigger signal is received.

No. 2: PWM 750, 33, 3. A pre-heating trigger signal is generated.
Referring to the flow-chart in FIG. 2, the flow goes from Step 402 for reading the waveform command, to Step 403 for decoding, to Step 405 for generating for waveform trigger parameters, to Step 409 for writing the waveform trigger parameters to the buffer memory, and to Step 402 to execute a next command.

Meanwhile, in Step 410, the buffer memory accesses the waveform trigger parameters; in Step 412, a pulse-width modulation (PWM) pulse train is generated; and then in Step 410, a next waveform trigger parameter is awaited.

No. 3: PWM 1000,75,2. A heating trigger signal is generated.

Even though the parameters are not the same, the execution flow is identical to that for No. 2 and description thereof is not presented here.

No. 4: BTEST In1,0,1. The external input signal is examined to decide whether annealing is necessary. If yes, the flow goes to execute a next command; otherwise, a next trigger is awaited.

Referring to the flow-chart in FIG. 2, the flow goes from Step 402 for reading the waveform command, to Step 403 for decoding, to Step 406 for testing the In1 condition to decide the execution path, to Step 407 for deciding the program counter, and to Step 402 to execute a next command.

No. 5: PWM 500,50,4. An annealing signal is generated.

Even though the parameters are not the same, the execution flow is identical to that for No. 2 and description thereof is not presented here.

No. 6: JMP 1. A next trigger is awaited.

Referring to the flow-chart in FIG. 2, the flow goes from Step 402 for reading the waveform command, to Step 403 for decoding, to Step 406 for the GOTO command, to Step 407 for deciding the program counter, and to Step 402 to execute a next command.

When the aforesaid program starts to execute, a laser trigger signal as shown in FIG. 6 is generated. In FIG. 6, the X-axis represents time, while 1, 2, 3, 4, 5 corresponds to the operation time (t) for the commands labeled Nos. 1, 2, 3, 4, 5 in FIG. 5. The function of the command labeled No. 6 in FIG. 5 is to enable the waveform command decoder (as shown in FIG. 1) to go to the command labeled No. 1 to repeat executing, which is not shown in FIG. 6. In FIG. 6, the laser trigger signal comprises five periods such as Start, Trig, In1, PWM Out and Status. Start means the program starts to execute. Trig indicates that the trigger signal is received. In1 indicates that the external input is detected by a BTEST command. The PWM Out indicates that the laser PWM trigger signal is output. Status indicates that the laser execution signal is output (ON). The aforesaid periods take place according to the X-axis, instead of a from-top-to-bottom order. In FIG. 6, 1, 2, 3, 4, 5 corresponds to the operation time (t) for the commands labeled Nos. 1, 2, 3, 4, 5 in FIG. 5. For example, 1 represents the cycle in which the wait command labeled No. 1 in FIG. 5 is executed. 2 represents the cycle in which PWM 750,33,3 labeled No. 2 in FIG. 5 is executed. Accordingly, from FIG. 5 and FIG. 6, the continuous steps for generating a laser trigger signal by executing waveform program can be summarized hereinafter. First, the wait command labeled No. 1 waits for the external trigger signal. Then, the PWM commands labeled No. 2 and No. 3 are combined to generate a PWM signal. The BTEST command labeled No. 4 detects the external signal to detect the status of the external feedback signal and change the execution flow of the waveform program in real time so as to determine whether the PWM command labeled No. 5 is to be executed. The JMP command labeled No. 6 is used to execute the waveform command to generate a next trigger signal. In FIG. 7, the generated PWM output (Out) is changed when the external input (In1) is changed.

According to the above discussion, it is apparent that the present invention discloses a programmable laser trigger device and method for controlling the programmable laser trigger device, capable of generating unequal pulse outputs with good flexibility to meet the requirements of various manufacturing processes and modulating the output laser pulses in real time in response to an external feedback signal.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A programmable laser trigger device, configured to receive a user-programmed waveform command to generate an output laser trigger signal by executing a waveform command code, the programmable laser trigger device comprising:
   an external signal module, configured to interface with the input and the output laser trigger signal when the waveform command is executed;
   a command executing module, comprising:
   at least a waveform command memory, configured to store the waveform command;
   at least a waveform command decoder, configured to access the waveform command for pre-decoding an executing code;
   at least a waveform generator, configured to transform a sequence of waveform trigger parameters into a pulse-width modulation (PWM) pulse train; and
   at least a buffer memory, configured to serve as a waveform trigger parameter buffer between the waveform command decoder and the waveform generator; and
   a management module, configured to manage the programmable laser trigger device;
   wherein, the waveform command comprises:
   a wait command, configured to wait for an external feedback signal so that following commands are executed after the external feedback signal is established;
   a pulse-width modulation (PWM) command, configured to set the waveform trigger parameters; and
   a GOTO command, configured to be triggered by the external feedback signal, the GOTO command comprising an unconditional or a conditional branch command.

2. The programmable laser trigger device as recited in claim 1, wherein the external signal module comprises:
   at least an input interface, configured to decode external signals; and
   at least an output interface, configured to output the pulse train.

3. The programmable laser trigger device as recited in claim 2, wherein the output interface comprises an output restriction mechanism configured to set protection parameters to prevent abnormal output waveforms.

4. The programmable laser trigger device as recited in claim 1, wherein the management module comprises:
   a microprocessor, configured to access the waveform command; and
   a laser controller, configured to control and communicate with the programmable laser trigger device and the user, the laser controller being configured to generate a waveform command and transmitting the waveform command into the command executing module for waveform transform.

5. The programmable laser trigger device as recited in claim 4, wherein the laser controller comprises a user interface configured to edit and display a programmed waveform.

6. The programmable laser trigger device as recited in claim 1, wherein the waveform command is accessed by the waveform command decoder so as to generate a programmable laser trigger pulse by sequential command execution or branch command execution.

7. The programmable laser trigger device as recited in claim 1, wherein the wait command and the GOTO command receive trigger signals input from the external signal module.

8. The programmable laser trigger device as recited in claim 1, wherein the feedback signal comprises signals from a position decoder, a speedometer/accelerometer and a thermometer, and is transmitted to the wait command and the GOTO command.

9. The programmable laser trigger device as recited in claim 1, wherein the buffer memory is a FIFO memory or a memory with a buffer structure.

10. A method for controlling a programmable laser trigger device, the method comprising steps of:
    A. accessing a waveform command;
    B. decoding the waveform command;
    C. determining and executing the waveform command;
    D. setting waveform trigger parameters;
    E. transmitting the waveform trigger parameters into a buffer memory;
    F. acquiring the waveform trigger parameters from the buffer memory and transmitting the waveform trigger parameters to a waveform generator; and
    G. transforming a sequence of waveform trigger parameters into a pulse-width modulation (PWM) pulse train by the waveform generator;
    wherein, the waveform command determined and executed in Step C comprises:
        a wait command, configured to wait for an external feedback signal so that following commands are executed after the external feedback signal is established;
        a pulse-width modulation (PWM) command, configured to set the waveform trigger parameters; and
        a GOTO command, configured to be triggered by the external feedback signal, the GOTO command comprising an unconditional or a conditional branch command.

11. The method for controlling a programmable laser trigger device as recited in claim 10, wherein the Step A to Step E are executed by a command executing module.

12. The method for controlling a programmable laser trigger device as recited in claim 10, wherein the command executing module comprises:
    at least a waveform command memory, configured to store the waveform command;
    at least a waveform command decoder, configured to access the waveform command for pre-decoding an executing code;
    at least a waveform generator, configured to transform a sequence of waveform trigger parameters into a pulse-width modulation (PWM) pulse train; and
    at least a buffer memory, configured to serve as a waveform trigger parameter buffer between the waveform command decoder and the waveform generator.

13. The method for controlling a programmable laser trigger device as recited in claim 10, wherein the waveform command memory is configured to store the waveform command to be accessed in Step A.

14. The method for controlling a programmable laser trigger device as recited in claim 10, wherein a microprocessor is used to be the interface and the accessing for the waveform command.

15. The method for controlling a programmable laser trigger device as recited in claim 14, wherein the microprocessor is configured to transmit a waveform command code to the waveform command memory.

16. The method for controlling a programmable laser trigger device as recited in claim 14, wherein the microprocessor is disposed in a management module comprising a laser controller that is configured to control and communicate with the programmable laser trigger device and the user.

17. The method for controlling a programmable laser trigger device as recited in claim 16, wherein the laser controller comprises a user interface configured to create, edit, and display a programmed waveform.

18. The method for controlling a programmable laser trigger device as recited in claim 10, wherein trigger signals for the wait command and the GOTO command are input from the external signal module or triggered by internal conditions.

19. The method for controlling a programmable laser trigger device as recited in claim 18, wherein the external signal module comprises:
    at least an input interface, configured to decode external signals; and
    at least an output interface, configured to output the pulse train.

20. The method for controlling a programmable laser trigger device as recited in claim 10, wherein the feedback signal comprises signals from a position decoder, a speedometer/accelerometer and a thermometer, and is transmitted to the wait command and the GOTO command.

21. The method for controlling a programmable laser trigger device as recited in claim 10, wherein the buffer memory in Step E is a FIFO memory or a memory with a buffer structure.

* * * * *